(12) United States Patent
Kirchmeier

(10) Patent No.: US 7,274,266 B2
(45) Date of Patent: Sep. 25, 2007

(54) RADIO FREQUENCY EXCITATION ARRANGEMENT

(75) Inventor: Thomas Kirchmeier, Teningen (DE)

(73) Assignee: Huettinger Elektronik GmbH + Co. KG, Freiburg (DE)

( * ) Notice: Subject to any disclaimer, the term of this patent is extended or adjusted under 35 U.S.C. 154(b) by 80 days.

(21) Appl. No.: 11/351,929

(22) Filed: Feb. 10, 2006

(65) Prior Publication Data

US 2006/0181352 A1 Aug. 17, 2006

(30) Foreign Application Priority Data

Feb. 12, 2005 (EP) .................................. 05003011

(51) Int. Cl.
- H04L 27/04 (2006.01)
- H03K 7/02 (2006.01)
- H03C 1/36 (2006.01)
- H03C 1/38 (2006.01)

(52) U.S. Cl. .................. 332/116; 332/115; 332/106; 332/149; 375/353

(58) Field of Classification Search ........... 332/116, 332/115, 106, 149; 375/353
See application file for complete search history.

(56) References Cited

U.S. PATENT DOCUMENTS

| | | | |
|---|---|---|---|
| 2,804,595 A * | 8/1957 | Soffel | ................. 332/106 |
| 5,239,275 A | 8/1993 | Leitch | |
| 6,194,978 B1 | 2/2001 | Romano | |
| 6,198,361 B1 * | 3/2001 | Arisawa | ................. 332/115 |
| 6,292,067 B1 * | 9/2001 | Sasabata et al. | ........... 332/115 |
| 6,583,678 B2 * | 6/2003 | Kunzer | ................. 332/106 |
| 2004/0104809 A1 * | 6/2004 | Rizzo et al. | ............. 340/10.34 |

FOREIGN PATENT DOCUMENTS

| | | |
|---|---|---|
| EP | 1 248 353 | 10/2002 |
| EP | 1 411 694 | 4/2004 |
| WO | WO 02/03541 | 1/2002 |

OTHER PUBLICATIONS

European Search Report for Application No. EP 05 00 3011, 2 pages, May 9, 2005.

* cited by examiner

Primary Examiner—Joseph Chang
(74) Attorney, Agent, or Firm—Fish & Richardson P.C.

(57) ABSTRACT

A method is performed for influencing the signal shape of an output signal of an RF power resonance amplifier and an RF excitation arrangement including an RF power resonance amplifier. A basic signal of a basic frequency is amplified and modulated with a modulation signal, and an output oscillating circuit of the RF power resonance amplifier is tuned to a frequency in the range of the basic frequency, and is excited with the basic signal during normal operation. At times that are or can be predetermined, the output oscillating circuit is driven with a driving signal that differs from the basic signal, for a time period that is or can be predetermined. This reduces the dying down time of the output oscillating circuit and increases the steepness of the output signal edges.

25 Claims, 3 Drawing Sheets

RADIO FREQUENCY EXCITATION ARRANGEMENT

CROSS REFERENCE TO RELATED APPLICATIONS

This application claims priority under 35 U.S.C. §119(a) to EP 05 003 011.3, filed Feb. 12, 2005, the entire contents of which is hereby incorporated by reference.

TECHNICAL FIELD

The application relates to a method for influencing the signal shape of an output signal of a radio-frequency (RF) power resonance amplifier.

BACKGROUND

For RF power generators that operate in pulsed operation, the switching-on edge of the RF power, i.e. the edge of the envelope of the output signal of the RF power generator, is in general an important criterion. There are also applications in which it is useful to interrupt the pulses within a minimum time. One example of such an application is the operation of opto-acoustic Q-switches in pulsed inscription lasers. In this case, for example, the 27 MHz RF power of the RF power generator is supposed to drop at the pulse end within maximally 100 ns, i.e., 2.5 oscillating periods from 50 W to less than 50 mW. One problem with the use of a resonance amplifier consists in that two quality features depend on the quality of the output oscillating circuit. The spectral purity of the output signal increases with increasing quality as does the dying down period upon switching off.

DE 199 29 332 A1 discloses a driver for a Q-switch or other acousto-optical components for laser applications. The driver includes a radio frequency oscillator and an amplifier fed with the signal of the radio frequency oscillator for driving the acousto-optical component, having a bandwidth which exceeds several times the frequency of the radio frequency oscillator, and a control input for setting the amplification of the amplifier to control the influence on a laser beam by the acousto-optical component. This approach uses an amplifier with a very large bandwidth that controls the higher frequency portions contained in steep signal edges to a sufficient degree.

SUMMARY

A method and a device for generating output signals of a pulsed RF power resonance amplifier is described. The output signals have steep edges.

An output oscillating circuit of the RF power resonance amplifier is driven with a driving signal that differs from a basic signal of an oscillator that feeds the RF power resonance amplifier at points in time that are predeterminable, that is either predetermined or can be predetermined. The driving signal can differ from the basic signal, in particular, in terms of phase position and/or frequency and/or pulse-duty factor. Preferably, at least one of these variables differs by at least 5% from the corresponding variable of the basic signal during normal operation. Normal operation is the operation at the basic frequency without generating a driving signal.

These actions accelerate excitation and dying down of oscillations of the output oscillating circuit compared to natural exponential excitation and dying down of oscillations. Thus, the envelope of the output signal follows the signal shape of the modulation signal more precisely than with a resonance amplifier without driving signal. Compared to the broadband amplifier of DE 199 29 332 A1, the envelope obtained is of similar good quality, only the technology is greatly facilitated and less expensive. If the modulation signal is a rectangular signal, i.e., a pulsed signal, the envelope of the output signal has steep edges. The driving signal may, for example, be generated by deliberately extending the on-time upon initial switching-on of the switching element/s of the RF power resonance amplifier or by supplying the output oscillating circuit with a higher voltage or power than during normal operation through use of an additional switch.

If several oscillating circuits are provided in the RF power resonance amplifier, it is possible to drive several oscillating circuits with the driving signal that differs from the basic signal.

The method can, in particular, accelerate the dying down of a pulsed basic signal. Driving with a driving signal that differs from the basic signal at least partially eliminates the energy stored in the output oscillating circuit, which considerably shortens the dying down process. In this manner, the duration of the dying down process can be reduced with an output oscillating circuit with high quality. For this reason, an output oscillating circuit with high quality and good filtering effect can be used thereby generating an output signal having a large spectral purity.

In one implementation, the output oscillating circuit may be driven with a driving signal that considerably differs from the basic signal for a length of time that is or can be predetermined. This particularly optimizes rapid dying down.

In another implementation, the point in time and length of time may be selected to obtain an envelope of the output signal having steep edges. This can be achieved, in particular, by generating the driving signal in dependence on the modulation signal. The modulation signal generates, for example, a pulsed output signal of the RF power resonance amplifier. The start and end of a pulse of the modulation signal generally may require a steep edge of the envelope of the output signal. For this reason, each pulse of the modulation signal may be followed by excitation of the output oscillating circuit with one or more intentional "wrong" cycles.

The driving signal can be generated in one manner by changing the basic signal, in particular, the frequency, phase, and/or pulse-duty ratio of the basic signal. Through excitation of the output oscillating circuit with the basic signal, i.e., with the basic frequency and the basic phase, the output oscillating circuit is operated in resonance. When the output oscillating circuit is excited with a different signal, oscillation of the output oscillating circuit is decelerated.

In another implementation, the control signal may be generated by a separate function generator that drives the output oscillating circuit either directly or by interposition of a switch, in particular, a transistor. A function generator can generate almost any driving signal. The function generator can also drive one or more switching elements (for example, amplifying transistors) of the RF power resonance amplifier. A function generator disposed in this manner can generate a deceleration pulse when the driver stage of the RF power resonance amplifier stops delivering signals, i.e., when the modulation signal pulse pauses.

A coupling circuit may be disposed between the driver stage and the switching element/s. The coupling circuit may be designed as oscillating circuit. The oscillating circuit is usually selected to have its resonance frequency in the range of the basic frequency to drive the switching elements of the RF power resonance amplifier with sufficient current and voltage and minimum energy loss. The driving signal, which differs from the basic signal, can be generated with a coupling circuit of this type by tuning the coupling circuit of the RF power resonance amplifier to which the basic signal is supplied, to a frequency other than the basic frequency $f_T$, i.e., to $f_0=f_T+\Delta$. The driver stage and hence the coupling circuit therefore operate consistently at the frequency $f_T$ as long as a pulse of the modulation signal is applied. As soon as it stops, the coupling circuit dies down with several dying down periods of the frequency $f_0$. Driving of the switching element and the output oscillating circuit with this frequency, which is phase-shifted to the basic frequency $f_T$, produces the changed driving signal and thereby one or more deceleration pulses.

Experiments have shown that good results are obtained if $f_0$ differs by about 5% to about 20% from $f_T$, in particular, if $f_0$ is about 5% to about 20% less than $f_T$. If $f_0$ is approximately 10% less than $f_T$, after five periods at a frequency $f_0$, the amplitudes of an oscillation at $f_0$ and an imaginary continuing $f_T$ oscillation are in opposite phase, and the output signal shows no considerable oscillation any more (that is, less than about 0.1% from the output signal during normal operation).

A deceleration pulse can be generated as the driving signal and the output oscillating circuit is driven by the deceleration pulse. The energy stored in the output oscillating circuit can be eliminated by deceleration pulses that may be superposed to the basic signal or that can drive the output oscillating circuit alternatively to the basic signal, thereby considerably reducing the dying down process. The tailored deceleration pulses can be generated by a separate power transistor or through suitable driving of the existing active elements, in particular, one or more amplifier transistors. This driving may again be generated either by a separate function generator circuit or, in the simplest case, by the existing driver stage due to a frequency jump of the driver stage when the basic signal is switched off at the start of the modulation signal pulse pause.

In one general aspect, a method for influencing the signal shape of an output signal of an RF power resonance amplifier includes amplifying a basic signal of a basic frequency, modulating the basic signal with a modulation signal, tuning an output oscillating circuit of the RF power resonance amplifier to a frequency in the range of the basic frequency, and exciting the output oscillating circuit with the basic signal during normal operation. The method further includes driving the output oscillating circuit with a driving signal that differs from the basic signal at points in time to produce the output signal.

Implementations may include one or more of the following features. For example, modulating the basic signal may include pulsing the basic signal.

Driving the output oscillating circuit with the driving signal may include driving the output oscillating circuit with the driving signal at predetermined points in time. Driving the output oscillating circuit with the driving signal may include driving for a predetermined length of time. The length of time may be selected to produce an envelope of the output signal that has a steep edge at least at the falling edge. The point in time may be selected to produce an envelope of the output signal that has a steep edge at least at the falling edge.

The method may include generating the driving signal in dependence on the modulation signal. The method may further include generating the driving signal by changing the basic signal. Changing the basic signal may include changing one or more of the frequency, the phase, and the pulse-duty ratio of the basic signal. The method may include generating the driving signal by a separate function generator that drives the output oscillating circuit. The separate function generator may drive the output oscillating circuit directly. The separate function generator may drive the output oscillating circuit through an interposition of a switch. The switch may include a transistor.

The method may include tuning a coupling circuit of the RF power resonance amplifier to which the basic signal is supplied to a frequency differing from the basic frequency. The method may include generating a deceleration pulse as the driving signal, wherein the output oscillating circuit is driven by the deceleration pulse.

In another general aspect, an RF excitation arrangement includes an RF power resonance amplifier that includes a driver stage amplifying a basic signal, at least one active element, and at least one output oscillating circuit disposed downstream of the at least one active element. The output oscillating circuit is tuned to a frequency in the range of the basic frequency of the basic signal. The RF excitation arrangement includes a modulation signal generator that generates a modulation signal for modulating the basic signal. The RF excitation arrangement includes a driving signal unit that generates a driving signal, that differs from the basic signal, and that is input to the output oscillating circuit.

The output oscillating circuit can be generally designed as a resonance circuit that is substantially tuned to a basic frequency. The active elements may be amplifier stages or switching elements, such as, for example, one or more transistors. For example, the RF power resonance amplifier may be a class E amplifier that generally has one single transistor that is operated in switched operation. However, it is also feasible to operate an RF power resonance amplifier with several transistors and to operate the transistor/s also in the amplifying operation. An RF power resonance amplifier includes one or more resonance circuits to ensure that the basic wave (basic frequency of the basic signal) is transferred to a load (the active, in particular, switching elements (amplifier transistors) still generate a plurality of harmonic waves). The resonance circuit also ensures that the active elements are operated with minimum loss. Towards this end, the output oscillating circuit may be slightly mistuned relative to the basic frequency. The RF excitation arrangement has high quality, high spectral purity, good filtering effect.

The driving signal can be generated in dependence on the modulation signal when the driving signal unit is connected to the modulation signal generator.

A control signal in the form of one or more decelerating pulses can be generated in a particularly easy manner when the driving signal unit includes at least one switch, such as, for example, a power transistor.

The driving signal shape can be influenced when the driving signal unit includes at least one function generator. The function generator may be connected directly to the amplifier transistor or through one or more transistors directly to the output oscillating circuit of the RF power resonance amplifier. It is also possible to use several function generators.

The at least one active element of the RF power resonance amplifier may be designed for operation up to a frequency in the range of the basic frequency. However, the at least one active element need not be designed for higher frequencies.

For this reason, active elements can be used that are less expensive than those used in prior amplifiers.

A driving signal can be generated with simple technical measures by connecting a coupling circuit between the driver stage and the at least one active element of the RF power resonance amplifier that is tuned to a frequency that is different from the basic frequency, to form a driving signal unit. Generation of a decelerating signal is can be accomplished, as explained above.

With particular advantage, the RF excitation arrangement and the method can be used for operating a Q-switch, for example, an opto-acoustic Q-switch. Pulsed radio frequency signals having extremely short dying down times at each pulse end are required for driving a Q-switch of this type.

Further features and advantages can be extracted from the following description, from the figures, and from the claims. The individual features may be realized individually or collectively in arbitrary combination.

DESCRIPTION OF DRAWINGS

Like reference symbols in the various drawings may indicate like elements.

DETAILED DESCRIPTION

Figure 1A:
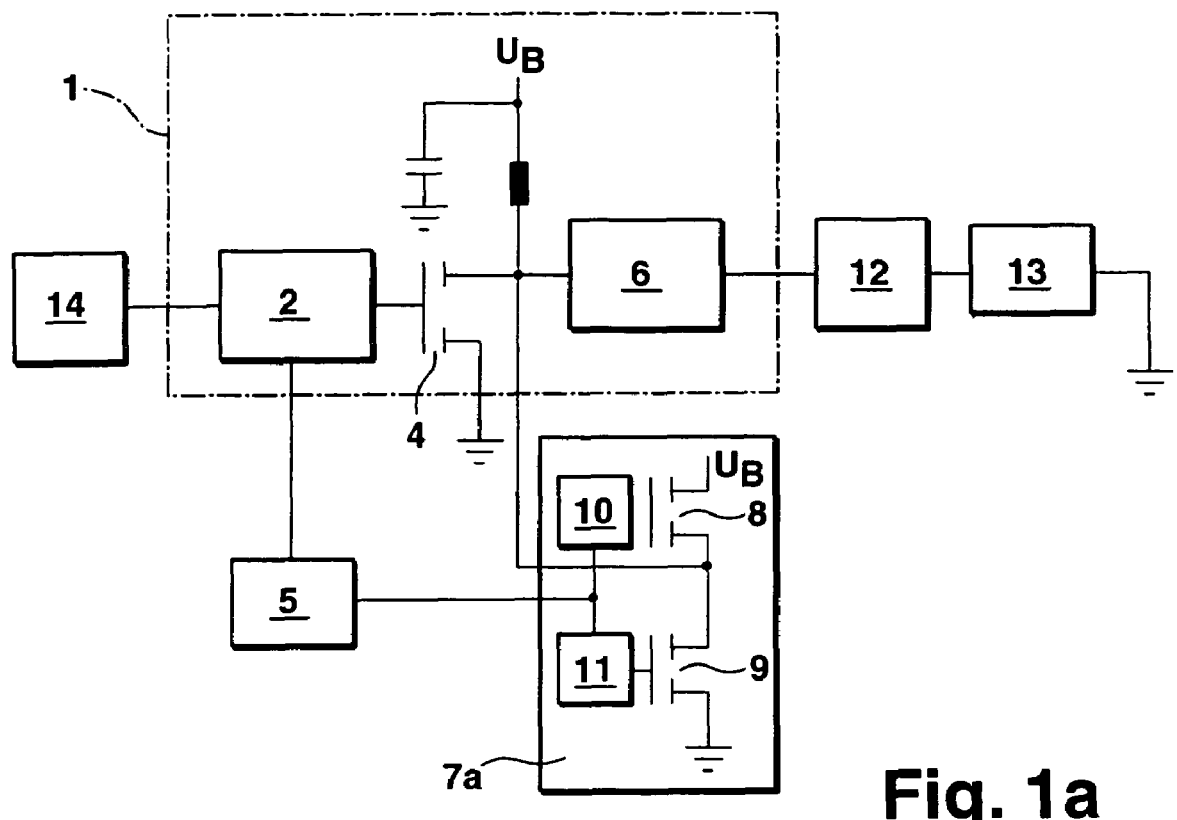
FIG. 1a is a schematic diagram of a first implementation of an RF excitation arrangement.

FIG. 1a shows a radio frequency (RF) excitation arrangement with an RF power resonance amplifier 1 that includes a driver stage 2 driving a switching element 4. The driver stage 2 is connected to an oscillator 14. The oscillator 14 provides a high-frequency signal (a basic signal) that is amplified by the driver stage 2, which thereby drives the switching element 4. The driver stage 2 is driven with a modulation signal from a modulation signal generator 5. The modulation signal has a frequency that is lower than the frequency of the basic signal. The basic signal has, for example, a basic frequency $f_T=27.12$ MHz and the modulation signal has, for example, a modulation frequency $f_2=100$ kHz. The modulation signal may be pulsed, in particular, with a rectangular signal, and can have any pulse-duty ratio.

An amplified RF signal is present at the output of an output oscillating circuit 6 and hence at the output of the RF power resonance amplifier 1. This RF signal is an amplified version of the basic signal, which is modulated with the modulation signal from the modulation signal generator 5. The output oscillating circuit 6 is tuned to a frequency in the range of the basic frequency of the basic signal. A rectangular signal with a predetermined pulse/pause ratio is generally used as the modulation signal. This means that the output signal of the RF power resonance amplifier 1 is a pulsed RF signal. During a pulse pause of the modulation signal, the output signal should quickly die down. If the output oscillating circuit 6 is temporarily not excited by the driver stage 2 due to a modulation signal pulse pause, the output oscillating circuit 6 continues to oscillate. To minimize this further oscillation or dying down oscillation, the output oscillating circuit 6 is driven by a driving signal that differs from the basic signal. There are several possibilities to accomplish this. In FIG. 1a, the RF excitation arrangement includes a driving signal unit 7a that includes two switches 8, 9 designed as transistors that are each driven by a function generator 10, 11. To ensure that the driving signal is transferred to the output oscillating circuit 6 at the right time and with the correct length, the function generators 10, 11, and hence the driving signal unit 7a, are connected to the modulation signal generator 5 to enable generation of the driving signal in dependence on the modulation signal. The output power of the RF power resonance amplifier 1 can be adjusted using the voltage supply $U_B$. The driving signal unit 7a also can be supplied by $U_B$, as shown in FIG. 1a, or it can be supplied by an independent voltage or a current source.

An impedance adjustment member 12 may be connected downstream of the RF power resonance amplifier 1. The impedance adjustment member 12 is thereby disposed between the output oscillating circuit 6 and a load 13 that may be designed as Q-switch and may be operated by the output signal. The impedance adjustment member 12 and the load 13 also may be able to oscillate and hence have a resonance frequency. A quartz Q-switch, for example, has a resonance frequency. The dying down behavior of the output oscillating circuit 6 can thereby depend on the downstream elements. If, for example, the resonance frequencies of the impedance adjustment member 12 and/or the load 13 are known, they can be taken into consideration for generating the driving signal in such a manner that the dying down of the output oscillating circuit 6 connected downstream of the switching element 4 is accelerated due to lack of excitation by the basic signal.

Figure 1B:
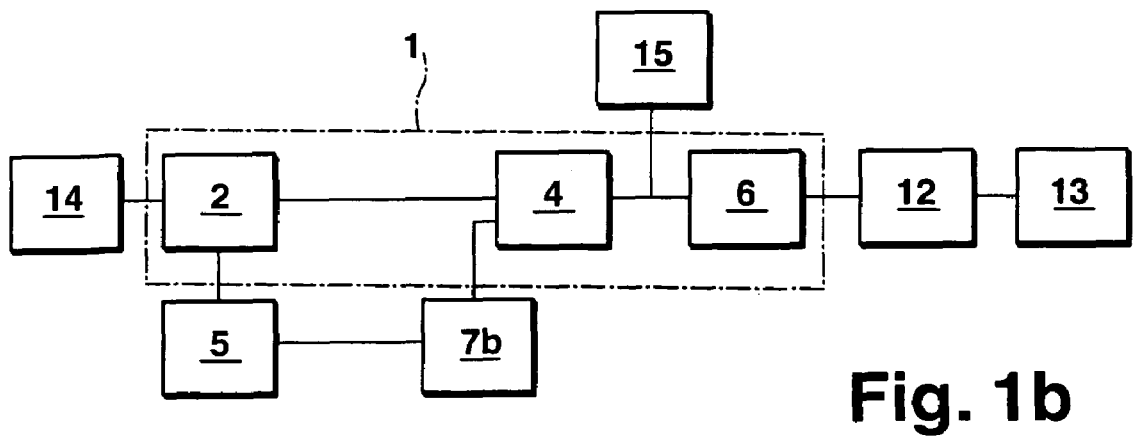
FIG. 1b is a schematic diagram of a second implementation of an RF excitation arrangement with a driving signal unit driving a switching element of the RF power resonance amplifier.

The corresponding components are designated with the same reference numerals below. In contrast to FIG. 1a, a driving signal unit 7b of FIG. 1b is connected to the switching element 4. The RF excitation arrangement of FIG. 1b also includes an external direct current supply 15.

Figure 1C:
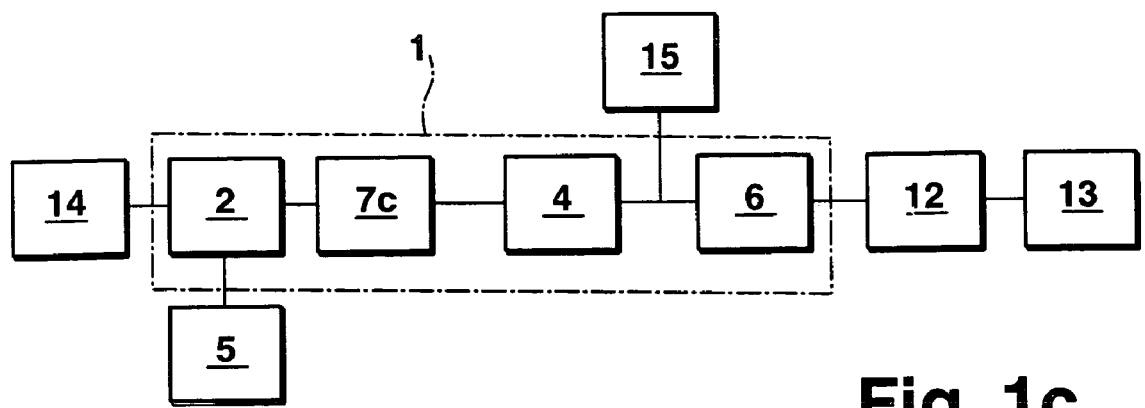
FIG. 1c is a schematic diagram of a third implementation of an RF excitation arrangement with driving signal unit disposed between a driver stage and a switching element.

Referring to FIG. 1c, the driving signal is generated by a driving signal unit 7c that is designed as a coupling circuit by tuning the coupling circuit to a frequency $f_0=f_T+\Delta$ that is different from the basic frequency $f_T$. For this reason, the driver stage 2 and hence also the coupling circuit (the driving signal unit 7c) are consistently operated at a frequency $f_T$ as long as a positive level of the modulation signal is applied. Upon termination of the modulation signal, the coupling circuit dies down with a few dying down periods of the frequency $f_0$. The driving signal is generated through driving the switching element 4 and the output oscillating circuit 6 at the frequency $f_o$, which is phase-shifted compared to the basic frequency $f_T$.

Figure 1D:
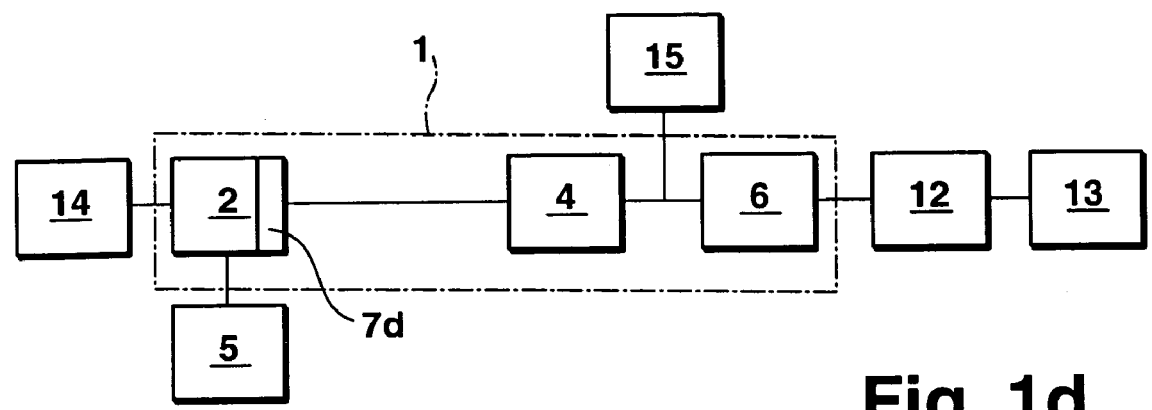
FIG. 1d is a schematic diagram of a fourth implementation of an RF excitation arrangement with a driving signal unit disposed in a driver stage.

Referring to FIG. 1d, the driver stage 2 is designed as a driving signal unit or the driver stage 2 includes a driving signal unit 7d. The driving signal is generated by changing the basic signal $f_T$ in the driver stage 2 or in the driving signal unit 7d.

Figure 1E:
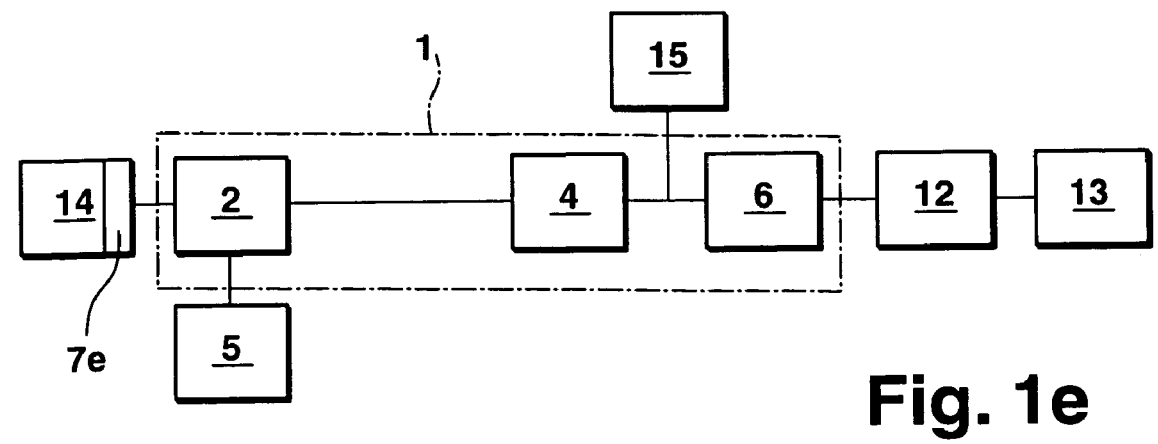
FIG. 1e is a schematic diagram of a fifth implementation of an RF excitation arrangement with a driving signal unit disposed in an oscillator.

Another way to generate the driving signal is shown in FIG. 1e. In FIG. 1e, the oscillator 14 represents a driving signal unit or the oscillator 14 includes a driving signal unit 7e. Thus, the driving signal is generated by changing the basic signal in the oscillator 14 or in the driving signal unit 7e contained within the oscillator 14. The oscillator 14 may therefore consist, for example, of a quartz oscillator or a similar frequency-stable oscillating structure and an external logic, for example, a logic component that can be programmed (such as a complex programmable logic device or a CPLD). In this case, the modulation signal also would be associated with the oscillator 14.

FIGS. 1a-1e show the elements 5, 7a, 7b, 12, 14, 15 outside of the RF power resonance amplifier 1. In another implementation, these elements may, be a part of or within the RF power resonance amplifier 1.

Figure 2A:
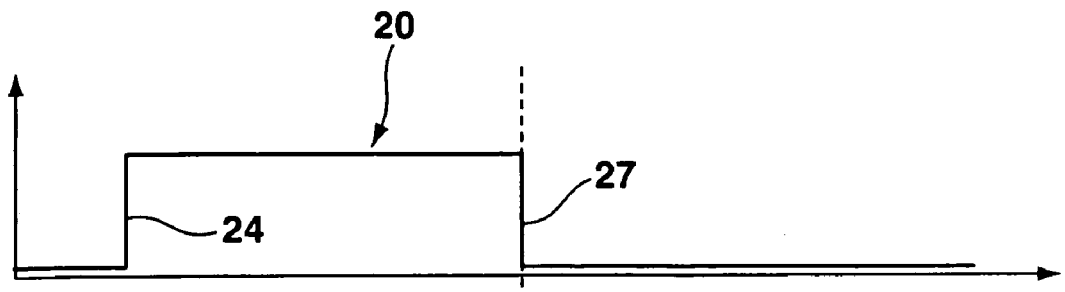
FIG. 2a is a graph of a modulation signal from a modulation signal generator.

FIGS. 2a through 2e show schematic views of signals that need not be to scale but better clarify the principle of function. FIG. 2a shows, for example, a graph of a modulation signal 20 that can be generated by the modulation signal generator 5. As shown in FIG. 2a, the modulation signal 20 is a rectangular signal. The signal shape of the modulation signal 20 represents the desired signal shape of the envelope of the output signal of the output oscillating circuit 6.

Figure 2B:
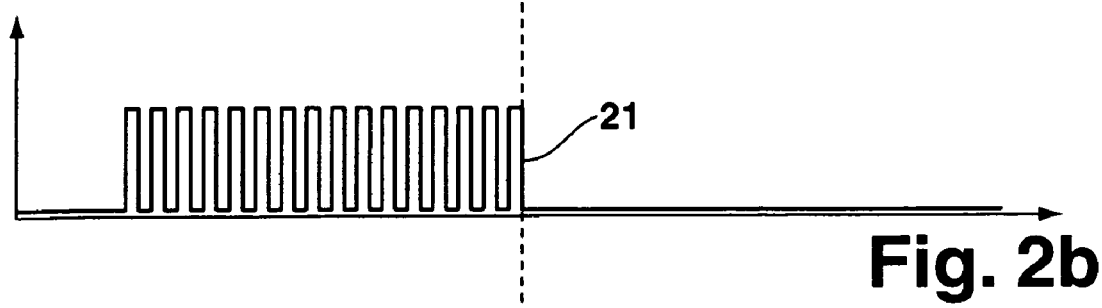
FIG. 2b is a graph of a basic signal that is amplitude-modulated with the modulation signal of FIG. 2a, and is followed by a driving signal.

FIG. 2b shows a graph of the basic signal from the oscillator 14, which is amplitude-modulated with the modulation signal 20. This means that the output oscillating circuit 6 is fed with a radio frequency input signal as long as the modulation signal 20 has a positive signal level.

Figure 2C:
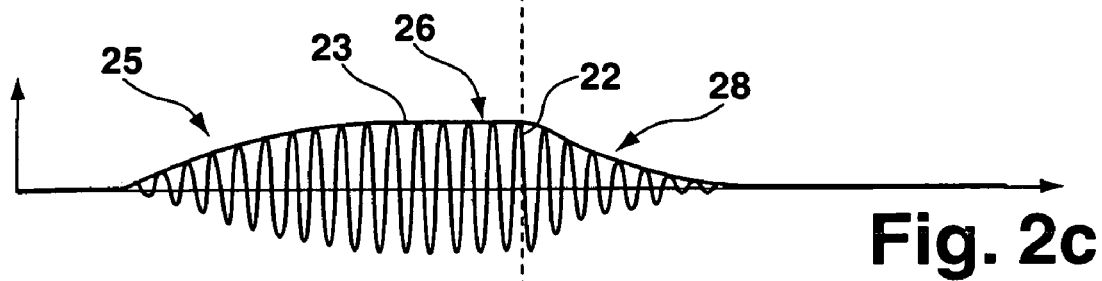
FIG. 2c is a graph of an RF output signal as generated without a driving signal.

FIG. 2c shows a graph of an output signal 22 of the output oscillating circuit 6 without applying a driving signal that is different from the basic signal. This graph also shows an envelope 23 of the output signal 22. The envelope 23 only gradually follows the rising edge 24 of the modulation signal 20 in the region 25 as long as the output oscillating circuit 6 oscillates. After a certain time, the envelope 23 reproduces the modulation signal 20 with relatively good precision in the region 26. After a falling edge 27 of the modulation signal 20, the output oscillating circuit 6 gradually dies down, which results in a flat edge 28 of the output signal 22.

Figure 2D:
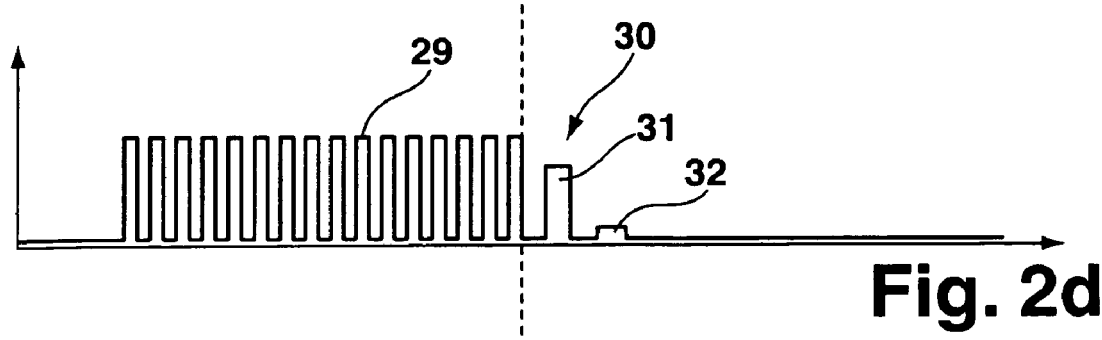
FIG. 2d is a graph of the basic signal that is amplitude-modulated with the modulation signal with driving signal.
Figure 2E:
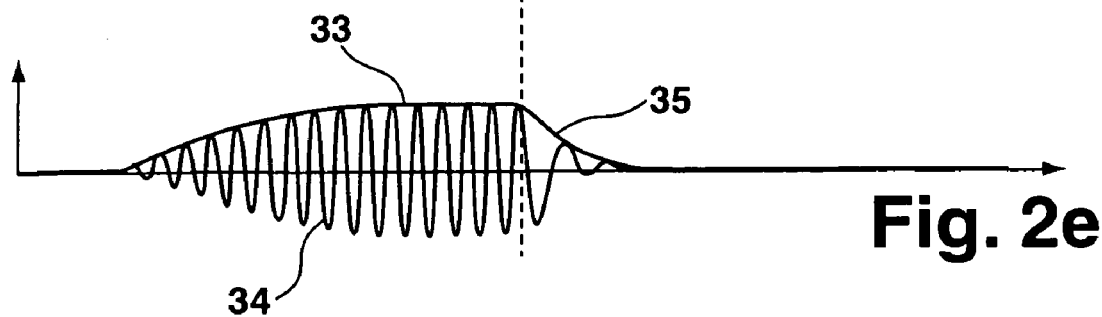
FIG. 2e is a graph of an RF output signal as produced with driving signal.

FIG. 2d shows a graph of the basic signal 29, which is amplitude-modulated with the modulation signal, followed by the driving signal 30 from the driving signal unit (such as 7a, 7b, 7c, 7d, 7e). As shown, the signal 29 does not abruptly stop after the falling edge 27 of the modulation signal 20, but a driving signal 30 is generated that has two deceleration pulses 31, 32. The output oscillating circuit 6 is driven by the driving signal 30 with the result that the output oscillating circuit 6 dies down more quickly so that the envelope 33 of an output signal 34 of the output oscillating circuit 6, as shown in FIG. 2e, has a steep edge 35. In particular, a "steep edge" is an edge in which an amplitude of the slope of the output signal 34 is steeper than approximately $-A/(5 \times T_T)$, where $T_T$ is a period of the basic frequency $f_T$, and A is an amplitude of the output signal 34 taken at the falling edge 27 of the modulation signal 20. This approximation is a rough linear approximation of a slope that likely follows a non-linear path. In one implementation, the slope of the output signal 34 can be steeper than approximately $-A/(2.5 \times T_T)$.

Other implementations are within the scope of the following claims.

What is claimed is:

1. A method for influencing the signal shape of an output signal of an RF power resonance amplifier, the method comprising:
    amplifying a basic signal of a basic frequency;
    modulating the basic signal with a modulation signal;
    tuning an output oscillating circuit of the RF power resonance amplifier to a frequency in the range of the basic frequency;
    exciting the output oscillating circuit with the basic signal during normal operation; and
    driving the output oscillating circuit with a driving signal that differs from the basic signal at predeterminable points in time to produce an output signal.

2. The method of claim 1 wherein modulating the basic signal includes pulsing the basic signal.

3. The method of claim 1 wherein driving the output oscillating circuit with the driving signal includes driving the output oscillating circuit with the driving signal at predetermined points in time.

4. The method of claim 1, wherein driving the output oscillating circuit with the driving signal includes driving for a predeterminable length of time.

5. The method of claim 4, wherein the length of time is selected to produce an envelope of the output signal that has a steep edge at least at the falling edge.

6. The method of claim 4, wherein the length of time is predetermined.

7. The method of claim 1, wherein points in time are predetermined.

8. The method of claim 1, wherein the point in time is selected to produce an envelope of the output signal that has a steep edge at least at the falling edge.

9. The method of claim 1, further comprising generating the driving signal in dependence on the modulation signal.

10. The method of claim 1, further comprising generating the driving signal by changing the basic signal.

11. The method of claim 10, wherein changing the basic signal includes changing one or more of the frequency, the phase, and the pulse-duty ratio of the basic signal.

12. The method of claim 1, further comprising generating the driving signal by a separate function generator that drives the output oscillating circuit.

13. The method of claim 12, wherein the separate function generator drives the output oscillating circuit directly.

14. The method of claim 12, wherein the separate function generator drives the output oscillating circuit through an interposition of a switch.

15. The method of claim 14, wherein the switch includes a transistor.

16. The method of claim 1, further comprising tuning a coupling circuit of the RF power resonance amplifier to which the basic signal is supplied to a frequency differing from the basic frequency.

17. The method of claim 1, further comprising generating a deceleration pulse as the driving signal, wherein the output oscillating circuit is driven by the deceleration pulse.

18. An RF excitation arrangement comprising:
    an RF power resonance amplifier including:
        a driver stage amplifying a basic signal,
        at least one active element, and
        at least one output oscillating circuit disposed downstream of the at least one active element, wherein the output oscillating circuit is tuned to a frequency in the range of a basic frequency of the basic signal;

a modulation signal generator that generates a modulation signal for modulating the basic signal; and a driving signal unit that generates a driving signal that differs from the basic signal, and is input to the output oscillating circuit.

19. The RF excitation arrangement of claim 18, wherein the driving signal unit is connected to the modulation signal generator.

20. The RF excitation arrangement of claim 18, wherein the driving signal unit comprises at least one switch.

21. The RF excitation arrangement of claim 20, wherein the switch includes a power transistor.

22. The RF excitation arrangement of claim 18, wherein the driving signal unit comprises at least one function generator.

23. The RF excitation arrangement of claim 18, wherein the at least one active element of the RF power resonance amplifier is designed for operation up to a frequency in the range of the basic frequency.

24. The RF excitation arrangement of claim 18, further comprising a coupling circuit that is connected as the driving signal unit between the driver stage and the at least one active element of the RF power resonance amplifier, wherein the coupling circuit is tuned to a frequency differing from the basic frequency.

25. An RF excitation arrangement for operating a Q-switch, the arrangement comprising:

an RF power resonance amplifier including:
  a driver stage amplifying a basic signal,
  at least one active element, and
  at least one output oscillating circuit disposed downstream of the at least one active element, wherein the output oscillating circuit is tuned to a frequency in the range of a basic frequency of the basic signal;

a modulation signal generator that generates a modulation signal for modulating the basic signal; and a driving signal unit that generates a driving signal that differs from the basic signal, and is input to the output oscillating circuit.

* * * * *